United States Patent
Fellner

(10) Patent No.: US 8,294,475 B2
(45) Date of Patent: Oct. 23, 2012

(54) CIRCUIT ARRANGEMENT COMPRISING A FUSE AND A METHOD FOR DETERMINING A CONDITION OF A FUSE

(75) Inventor: Johannes Fellner, Pirka (AT)

(73) Assignee: Austriamicrosystems AG, Unterpremstätten (AT)

( * ) Notice: Subject to any disclaimer, the term of this patent is extended or adjusted under 35 U.S.C. 154(b) by 436 days.

(21) Appl. No.: 12/566,460

(22) Filed: Sep. 24, 2009

(65) Prior Publication Data

US 2010/0109677 A1    May 6, 2010

(30) Foreign Application Priority Data

Sep. 25, 2008    (DE) .................. 10 2008 048 830

(51) Int. Cl.
*H01H 85/30* (2006.01)
(52) U.S. Cl. ........................ 324/550; 327/525
(58) Field of Classification Search .............. 324/550; 327/525
See application file for complete search history.

(56) References Cited

U.S. PATENT DOCUMENTS

| | | | |
|---|---|---|---|
| 3,851,189 A * | 11/1974 | Moyer | 327/210 |
| 4,837,520 A | 6/1989 | Golke et al. | |
| 5,812,468 A | 9/1998 | Shirley | |
| 6,384,664 B1 * | 5/2002 | Hellums et al. | 327/525 |
| 6,384,666 B1 * | 5/2002 | Bertin et al. | 327/525 |
| 6,421,293 B1 | 7/2002 | Candelier et al. | |
| 6,525,955 B1 | 2/2003 | Smith et al. | |
| 6,549,063 B1 * | 4/2003 | Lehmann et al. | 327/525 |
| 6,995,601 B2 | 2/2006 | Huang et al. | |
| 7,019,534 B2 * | 3/2006 | Wu | 324/550 |
| 2009/0219746 A1 | 9/2009 | Bosmuller et al. | |

FOREIGN PATENT DOCUMENTS

DE    10 2006 017 480    11/2008

* cited by examiner

*Primary Examiner* — Timothy J Dole
(74) *Attorney, Agent, or Firm* — Cozen O'Connor

(57) ABSTRACT

A circuit arrangement including a fuse comprises a fuse path (SP) which is coupled to a control input (SE) and comprises the fuse (RS) and a first charge reservoir (C1) serially connected thereto for providing a first charge state (L1), a reference path (RP) which is coupled to the control input (SE) and comprises a comparison element (RV) and a second charge reservoir (C2) serially connected thereto for providing a second charge state (L2), and an evaluation unit (AE) comprising a first input (E1) connected to the fuse path (SP) in a switchable manner, a second input (E2) connected to the reference path (RP) in a switchable manner, and a data output (DA) for providing a condition of the fuse (RS) depending on a difference between the first and second charge states (L1, L2). Further, a method for determining the condition of a fuse is provided.

14 Claims, 2 Drawing Sheets

CIRCUIT ARRANGEMENT COMPRISING A FUSE AND A METHOD FOR DETERMINING A CONDITION OF A FUSE

RELATED APPLICATION

This application claims the priority of German Application No. 10 2008 048 830.5 filed Sep. 25, 2008, the entire content of which is hereby incorporated by reference.

FIELD OF THE INVENTION

The present invention is directed to a technique for determining the condition of a fuse.

BACKGROUND OF THE INVENTION

Fuses, also referred to as blowing elements or as a one time programmable cell (OTP cell) are common elements for permanently storing data, such as serial numbers, trimming adjustments of analog circuits or the like, on a chip. When such a circuit is switched on, the data content stored in the fuses has to be read out via an analog signal and must be evaluated. The result is usually stored in a digital memory.

Apart from the fuse, conventional circuits comprise a comparison element, a comparator and a memory element. The condition of the fuse is determined on the basis of a difference in potential between the fuse and the comparison element. For reading out the condition of the fuse, a statically stable condition of the circuit has to be reached in order to obtain, and subsequently evaluate, a stable difference in potential and/or voltage. To this end, it is required to build the circuit in exact symmetry in order to balance any runtime differences caused by parasitic capacities, above all those of a blowing transistor usually needed for programming the fuse. In addition, it is required to defer the read-out of the condition of the fuse until the transient process, which is in the range of 100 nanoseconds, is finished.

SUMMARY OF THE INVENTION

One object of the present invention is to provide a circuit arrangement and a method, serving for improving and accelerating the determination of the condition of a fuse.

In one embodiment, a circuit arrangement including a fuse comprises a fuse path coupled to a control input, a reference path coupled to the control input, and an evaluation unit. The fuse path comprises the fuse and a first charge reservoir serially connected thereto, and is designed for providing a first charge state. The reference path comprises a comparison element and a second charge reservoir serially connected thereto, and is designed for providing a second charge state. The evaluation unit comprises a first input, a second input as well as a data output for providing a condition of the fuse. The first input is connected to the fuse path in a switchable manner, and the second input is connected to the reference path in a switchable manner. The condition of the fuse is provided depending on a difference between the first and second charge states.

In doing so, the condition of the fuse is low-impedance or high-impedance and thus represents an unprogrammed or a programmed fuse.

The circuit arrangement is driven into a discharge phase or a charge phase via the control input. In the discharge phase, the first and second charge reservoirs are discharged by connecting the control input to a reference potential terminal. As a consequence, the first charge state is equal to the second charge state. The fuse path and the reference path, i.e. the first and second charge reservoirs, are charged in parallel in the charge phase by connecting the control input to a supply potential terminal. The evaluation unit determines the condition of the fuse depending on a difference between the first and second charge states during the charge phase.

By evaluating the difference between the respective charge state in the fuse path and in the reference path, it is advantageously possible to determine the condition of the fuse without waiting for a complete transient process of the circuit arrangement. This accelerates the determination of the condition of the fuse.

Each of the first and second charge reservoirs can be realized, for instance, as a transistor, for example as a metal oxide semiconductor, MOS transistor. In this case, a blowing transistor usually required in the fuse path for programming the fuse can be reused as first charge reservoir. Thus, the blowing transistor in the fuse path as well as a compensation in the reference path which is symmetric to the following transistor and is realized in the form of a MOS transistor, or of an equivalent capacity, are employed as first or second charge reservoir in the respective OFF-condition by making use of the respective parasitic capacity. Here, the first and second charge reservoirs are directly connected to a reference potential terminal.

Instead of the fuse, a so-called antifuse, for instance a Zener diode, may alternatively be used as a memory element as well. This element is of high impedance in the unprogrammed condition and of low impedance in the programmed condition.

In a further development, the first charge state is provided depending on a first charge time constant defined by a resistance of the fuse and a capacity of the first charge reservoir. The first charge state is provided at a first connection point between the fuse and the first charge reservoir. The second charge state is provided depending' on a second charge time constant defined by a resistance of the reference element and a capacity of the second charge reservoir. In this arrangement, the second charge state is provided at a second connection point between the reference element and the second charge reservoir.

In a further embodiment, the capacity of the first charge reservoir is matched with the capacity of the second charge reservoir. The resistance of the comparison element differs from the resistance of the fuse.

The resistance of the fuse differs by several decades in the unprogrammed and programmed conditions. This is why the resistance of the comparison element can be selected such that there is a significant difference between the first charge time constant and the second charge time constant.

Advantageously, the resulting difference between the first and second charge states can already be read out after a short time.

In a further embodiment, the evaluation unit comprises a storage comparator and a charge state monitor. The storage comparator comprises the first input which is coupled to the first connection point of the fuse path in a switchable manner, the second input which is coupled to the second connection point of the reference path in a switchable manner, and the data output. The charge state monitor comprises an input coupled to the data output of the storage comparator, and an output at which a switching signal for driving the storage comparator is provided.

The storage comparator compares the first charge state applied to its first input with a second charge state applied to its second input. The result of the comparison is provided at the data output and supplied to the input of the charge state monitor. The charge state monitor adjusts the switching signal at the data output depending on the result of the comparison and thus controls the coupling between the inputs of the storage comparator and the first and second connection points such that these connections are disconnected upon a change of the data output. Thus, the result of the comparison, i.e. the condition of the fuse, is held in the storage comparator. Due to its mode of operation, the storage comparator can also be referred to as a differential comparator.

Advantageously, the storage comparator is automatically turned off and the condition of the fuse is stored by uncoupling the inputs of the storage comparator from the first and/or second connection points immediately after the determination of the condition of the fuse. This reduces the power consumption.

In a further development, the condition of the fuse is provided at the data output in the form of a digital data signal and a digital data signal inverted thereto.

Here, the unprogrammed condition of a fuse corresponds to a logic 0 of the digital data signal and to a logic 1 of the inverted digital data signal, for example. The programmed condition of the fuse corresponds to a logic 1 of the digital data signal and to a logic 0 of the inverted digital data signal.

In a further embodiment, the storage comparator comprises a first and a second inverter. The first inverter has an input coupled to the first input of the storage comparator, and an output for providing the digital data signal. The second inverter has an input coupled to the second input of the storage comparator, and an output for providing the inverted digital data signal.

In a further development, the output of the first inverter is connected to the input of the second inverter in a switchable manner and so as to be controlled by the switching signal. The output of the second inverter is connected to the input of the first inverter in a switchable manner and so as to be controlled by the switching signal.

The first charge state is supplied to the first inverter, the second charge state to the second inverter. As soon as one of the inverters performs the switching operation, the switching signal produced by the charge state monitor causes a feedback operation of the two inverters. This feedback operation acts as a positive feedback because of the mutually inverted inputs of the inverters. At the same time, the inputs of the inverters are disconnected from the fuse path and the reference path, respectively. This function corresponds to the above mentioned driving of the storage comparator by means of the switching signal.

Due to the fact that a feedback is used between the two inverters, these are employed as both a comparator and a memory; advantageously, this keeps the number of the switching elements low.

In a further development, the charge state monitor comprises a NAND gate with an input for supplying the digital data signal, a further input for supplying the inverted digital data signal, and an output for providing the switching signal.

In the discharge phase of the circuit arrangement, the digital data signal as well as the inverted digital data signal are at logic 1. The NAND gate of the charge state monitor delivers a logic 0 at its output so as to couple the first input of the first inverter to the first connection point of the fuse path and the second input of the second inverter to the reference path via the second connection point. The switchable connection between the output of the first inverter and the input of the second inverter is open as is the switchable connection between the output of the second inverter and the input of the first inverter. As soon as the first or second charge state exceeds a respective switching threshold of the first or second inverter in the charge phase of the circuit arrangement, the output of the NAND gate of the charge state monitor changes to logic 1. This has the effect that the input of the first inverter is uncoupled from the first connection point and the input of the second inverter is uncoupled from the second connection point. The feedback loop between the first and second inverters is closed so as to hold the condition of the fuse in the storage comparator. As a result, the evaluation unit is locked. Since merely two capacities are charged, i.e. the first and second charge reservoirs, and the evaluation unit is rapidly locked, a dynamic charging current flows which is advantageously only very low. In case a MOS transistor is used for each of the first and second charge reservoirs, only the parasitic capacities of these transistors are made use of. Thus, the charge duration is determined in the charge phase of the circuit arrangement by the operating time of the inverter and of the NAND gate of the charge state monitor. Thus, the charge duration advantageously is largely reduced, significantly accelerating the determination of the condition of the fuse, for instance by the factor of 100.

In a further development, the control input is supplied with a digital control signal designed for switching between the discharge and charge phases of the circuit arrangement.

The digital control signal causes a connection of the control input to the reference potential terminal in the discharge phase, as well as a connection of the control input to the supply potential terminal in the charge phase.

In order to store the fuse condition in the first and second inverters, the connection of the control input to the supply potential terminal is not required so that this connection may be disconnected. Advantageously, a leakage current is reduced by a substantial amount through this measure.

In one embodiment, a method for determining a condition of a fuse comprises the discharging of a fuse path including a fuse and the discharging of a reference path, the charging of the fuse path and of the reference path and the determination of the condition of the fuse. During the charging process, a first charge state is generated in the fuse path as a function of a first charge time constant, and a second charge state is generated in the reference path as a function of a second charge time constant. The condition of the fuse is determined depending on a difference between the first and second charge states.

Advantageously, the determination of the condition of the fuse is accelerated by using differing charge time constants which result in different charge states.

BRIEF DESCRIPTION OF THE DRAWINGS

The invention is explained below by means of an exemplary embodiment on the basis of the Figures. Any components and circuit parts with the same function and effects have identical reference signs. In so far as circuit parts or components have identical function, the description thereof is not repeated in each of the following Figures.

DETAILED DESCRIPTION OF THE DRAWINGS

Figure 1:
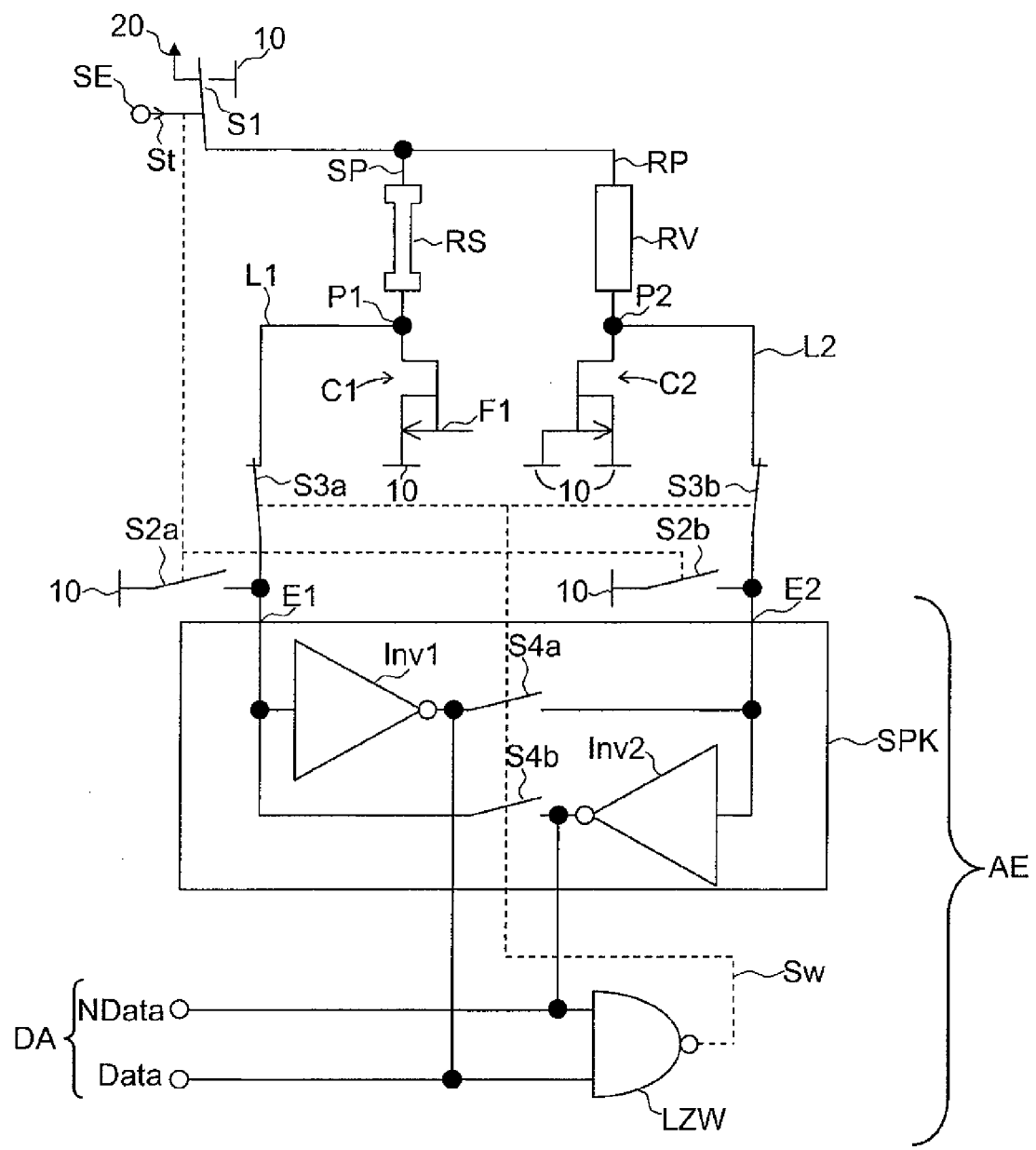
FIG. 1 shows an exemplary embodiment of a circuit arrangement according to the invention.

FIG. 1 shows an exemplary embodiment of a circuit arrangement according to the invention. The circuit arrangement comprises a fuse path SP, a reference path RP, an evaluation unit AE as well as a control input SE. The fuse path SP and the reference path RP are coupled to the control input SE. The fuse path SP comprises a series connection including a fuse RS and a first charge reservoir C1. The fuse SP is connected to a reference potential terminal 10 or a supply potential terminal 20 via a first switch S1. The first charge reservoir C1 is directly related to the reference potential terminal 10. A connection point between the fuse RS and the first charge reservoir C1 constitutes a first connection point P1 where a first charge state L1 is provided. The reference path RP includes a series connection comprising a comparison element RV and a second charge reservoir C2. The comparison element RV is coupled to the reference potential terminal 10 or to the supply potential terminal 20 via the first switch S1. The second charge reservoir C2 is directly related to the reference potential terminal 10. A connection point between the comparison element RV and the second charge reservoir C2 constitutes a second connection point P2 where a second charge state L2 is provided. Via the control signal St at the control input SE the switch position of the first switch S1 is changed to either the reference potential terminal 10 or the supply potential terminal 20. The control input SE is supplied with a control signal St.

In this exemplary embodiment, the first charge reservoir C1 and the second charge reservoir C2 are each realized as NMOS transistors. In this case, the first charge reservoir C1 corresponds to a blowing transistor usually used for programming the fuse RS. The fuse RS is programmed by connecting a gate terminal F1 of the blowing transistor to the supply potential terminal 20. The parasitic capacities of said blowing transistor are also used as a first charge reservoir C1. A capacity of the second charge reservoir C2 is matched with a capacity of the first charge reservoir C1. In this way, a first charge time constant is established in the fuse path SP by a resistance of the fuse RS and the capacity of the first charge reservoir C1. The first charge state L1 is provided as a function of the first charge time constant in the first connection point P1. By analogy, a second charge time constant is established in the reference path RP by a resistance of the comparison element RV and the capacity of the second charge reservoir C2. The second charge state L2 is provided as a function of the second charge time constant at the second connection point P2. The resistance of the fuse RS is low in the unprogrammed condition, e.g. in the range of 50 to 100 ohm. In the programmed condition, the resistance of the fuse RS is high, in the range of 1 megohm, for instance. The resistance of the comparison element RV is selected such that it significantly differs from the resistance of the fuse RS. The resistance of the comparison element RV may amount to 1 kiloohm, for example. For this reason, the first charge time constant clearly differs from the second charge time constant, which is expressed as a significant difference between the first charge state L1 and the second charge state L2 at a given point in time.

The evaluation unit AE has a first input E1, a second input E2 and a data output DA. The first input E1 is either coupled to the reference potential terminal 10 via a second switch S2a or to the first connection point P1 of the fuse path SP via a third switch S3a. The second input E2 is either coupled to the reference potential terminal 10 via a second switch S2b or to the second connection point P2 of the reference path RP via a third switch S3b. The data output DA comprises a digital data signal Data, as well as a digital data signal NData inverted thereto. The evaluation unit AE comprises a storage comparator SPK and a charge state monitor LZW coupled thereto.

The storage comparator SPK comprises a first inverter INV1 and a second inverter INV2. An input of the first inverter INV1 is coupled to the first input E1 of the evaluation unit AE. An output of the first inverter INV1 provides the digital data signal Data. An input of the second inverter INV2 constitutes the second input E2 of the evaluation unit AE. The inverted digital data signal NData is provided at an output of the second inverter INV2. The output of the first inverter INV1 is coupled to the input of the second inverter INV2 through a fourth switch S4a. The output of the second inverter INV2 is coupled to the input of the first inverter INV1 via a fourth switch S4b.

The charge state monitor LZW comprises a NAND gate. An input of the charge state monitor LZW is connected to the output of the first inverter INV1. A second input of the charge state monitor LZW is connected to the output of the second inverter INV2. A switching signal Sw is provided at the output of the NAND gate of the charge state monitor LZW.

The control signal St supplied to the control input SE controls the first switch S1 and the second switches S2a and S2b. A positive level of the control signal St thereby results in connecting the first switch S1 to the reference potential terminal 10 and closing the second switches S2a and S2b. The first and second inputs E1 and E2 are each connected to the reference potential terminal 10. A falling edge of the control signal St results in connecting the control input SE to the supply potential terminal 20 and opening the second switches S2a and S2b. The switching signal Sw controls the third switches S3a and S3b as well as the fourth switches S4a and S4b.

A positive level of the control signal St controls the circuit arrangement so as to reach a discharge phase. The control input SE, the first and second inputs E1 and E2 as well as the gate terminal F1 are each connected to the reference potential terminal 10. The first and second charge reservoirs C1 and C2 are discharged. A logic 0 is applied to each of the inputs of the two inverters INV1 and INV2. This is why the outputs of the first and second inverters INV1, INV2 are at logic 1. The digital data signal Data as well as the inverted digital data signal NData are at logic 1, causing a logic 0 at the output of the NAND gate of the charge state monitor LZW. A logic 0 of the switching signal Sw causes the closing of the third switches S3a and S3b as well as the opening of the fourth switches S4a and S4b. No current flows after the discharge of the first and second charge reservoirs C1 and C2.

The determination of the condition of the fuse RS is initiated by a falling edge of the control signal St and the switching into a charge phase. The second switches S2a and S2b are opened. The control input SE is coupled to the supply potential terminal 20. The first connection point P1 is charged with the first charge time constant in a delayed manner, and the second connection point P2 is charged with the second charge time constant in a delayed manner. As soon as one of the connection points P1 and P2 reaches the switching threshold of the inverter INV1 or INV2 connected thereto, one of the data signals Data and NData changes to 0, causing a switching of the NAND gate of the charge state monitor LZW. The logic 1, provided in this manner, of the switching signal Sw opens the third switches S3a and S3b and closes the fourth switches S4a and S4b. Hence, the first input E1 is disconnected from the first connection point P1 and the second input E2 is disconnected from the second connection point P2. Closing the feedback connection via the fourth switches S4a and S4b between the first and second inverters INV1 and INV2 results in a positive feedback. A level of the digital data signal Data representing the condition of the fuse RS, as well as a level of the inverted digital data signal NData thus continue to be stored in the storage comparator SPK. Due to the positive feedback, the levels of the digital data signal Data and of the inverted digital data signal NData are transformed into digital levels.

When the condition of the fuse RS has been determined, the first switch S1 is switched again to reference potential terminal 10, the switches S2a and S2b staying open. As a result, the first charge reservoir C1 as well as the second charge reservoir C2 are coupled to the reference potential terminal 10 and discharged. A possible leakage current is reduced to a minimum.

Owing to the use of differing charge time constants, the condition of the fuse RS is provided much faster. The determination period is in the range of picoseconds. Disconnecting the storage comparator SPK from the fuse path SP and the reference path RP after the determination of the condition of the fuse RS lowers charging currents and reduces leakage currents. Advantageously, the circuit arrangement does not need any bias current source.

Figure 2A:
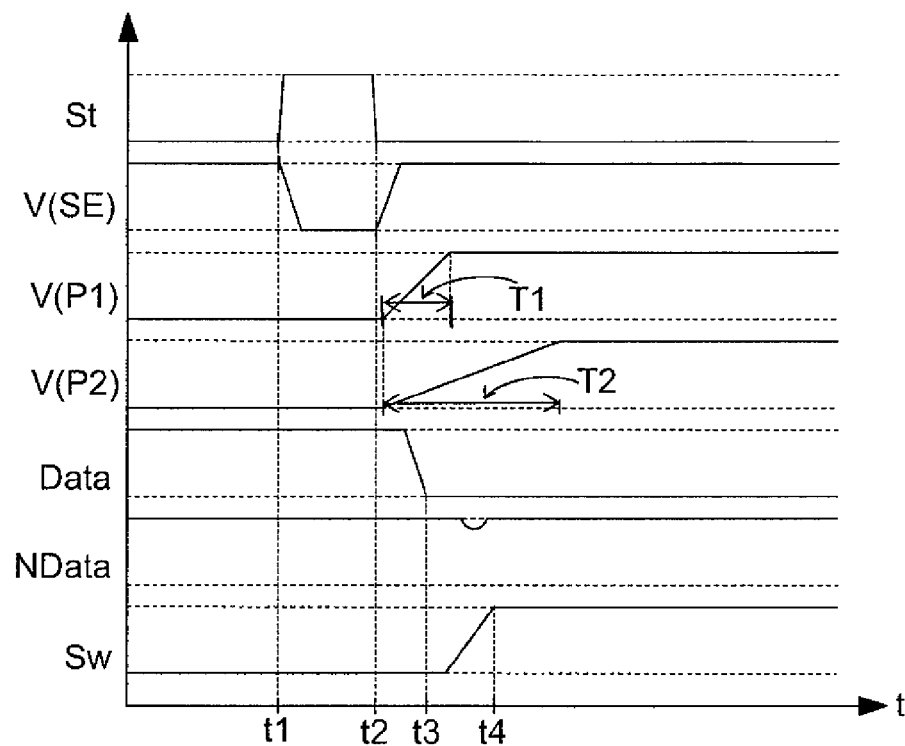
FIG. 2A shows exemplary signal diagrams for determining the condition of an unprogrammed fuse.

FIG. 2A shows exemplary signal diagrams to determine the condition of an unprogrammed fuse. The circuit arrangement of FIG. 1 forms the basis here.

In the unprogrammed condition of the fuse RS, a first charge time constant T1 is smaller than a second charge time constant T2. FIG. 2A shows profiles of various signals and/or potentials related to time t. The uppermost row shows a profile of the control signal St, the second row a profile of a potential at the control input SE, the third row a profile of a potential at the first connection point P1, the fourth row a profile of a potential at the second connection point P2, the fifth row a profile of the digital data signal Data, the sixth row a profile of the inverted digital data signal NData and the seventh row a profile of the switching signal Sw.

At a first point in time t1, the control signal St is set to logic 1. This is the beginning of a discharge phase. The control input SE adopts the potential of the reference potential terminal 10, i.e. logic 0. The potentials of the connection points P1 and P2 stay at logic 0 on account of the discharge. As a consequence, the levels of the digital data signal Data as well as of the inverted digital data signal NData are at logic 1. The level of the switching signal Sw is at logic 0.

The charge phase is initiated by a falling edge of the control signal St at a second point in time t2. Therefore, the potential at the fuse path SP and at the reference path RP rises to logic 1. The potential at the first connection point P1 and the potential at the second connection point P2 likewise rise. The respective increase is determined by the particular first and second charge time constants T1 and T2, respectively. As the first charge time constant T1 of the fuse path is smaller than the second charge time constant T2 of the reference path, the potential at the first connection point P1 rises faster. Accordingly, the switching threshold of the first inverter INV1 is reached at an earlier point in time and the digital data signal Data changes to logic 0 at a third point in time t3. The inverted digital data signal NData stays at logic 1. This results in switching the switching signal Sw from logic 0 to logic 1 at a fourth point in time t4. The state of the digital data signal Data and the state of the inverted digital data signal NData are kept in each case.

Figure 2B:
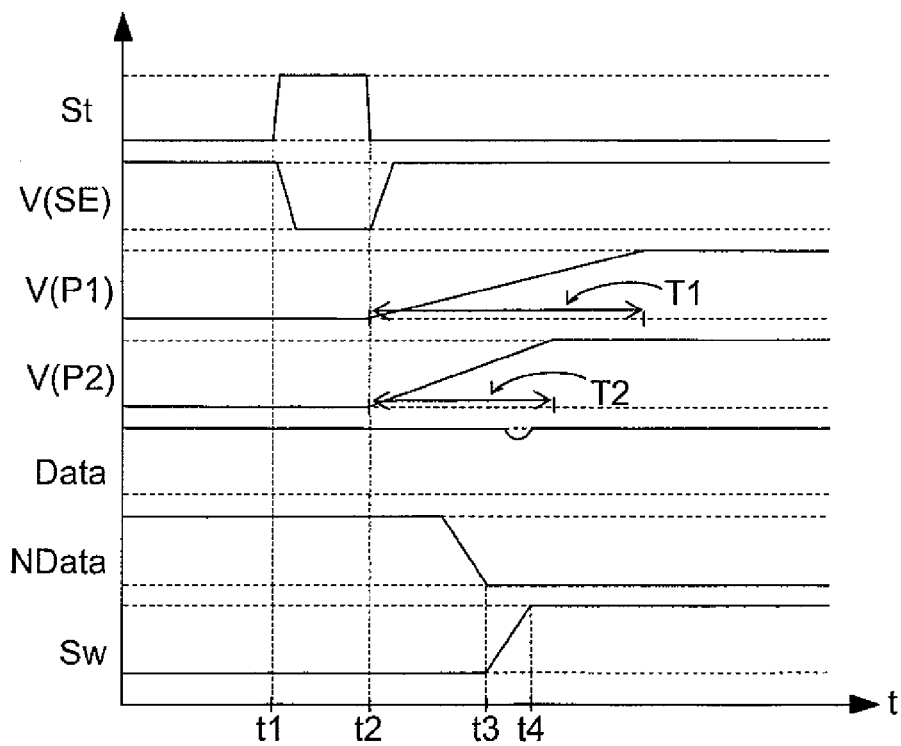
FIG. 2B shows exemplary signal diagrams for determining the condition of a programmed fuse.

FIG. 2B shows exemplary signal diagrams for the determination of the condition of a programmed fuse. Again, the circuit arrangement of FIG. 1 forms the basis here. The level profiles of the signals and potentials are illustrated one below the other corresponding to FIG. 2A. The profile of the discharge phase between the first point in time t1 and the second point in time t2 corresponds to the profile of the discharge phase described in FIG. 2A.

The charge phase is initiated at the second point in time t2 by the falling edge of the control signal St. In the case of the programmed fuse which is taken as a basis for this Figure, the first charge time constant T1 influencing the potential at the first connection point P1 is larger than the second charge time constant T2 influencing the potential at the second connection point P2. This is why the potential at the first connection point P1 rises after the second point in time t2 more slowly than the potential at the second connection point P2. In this case, the switching threshold of the second inverter INV2 is reached earlier and the inverted digital data signal NData is at logic 0 at a third point in time t3. The digital data signal Data stays at logic 1. Consequently, the switching signal Sw at the output of the NAND gate is at logic 1 at the fourth point in time t4. The condition of the fuse is stored in the form of the digital data signal Data and the inverted digital data signal NData.

The scope of protection of the invention is not limited to the examples given hereinabove. The invention is embodied in each novel characteristic and each combination of characteristics, which includes every combination of any features which are stated in the claims, even if this feature or combination of features is not explicitly stated in the examples.

I claim:

1. A circuit arrangement comprising:
    a fuse;
    a fuse path which is coupled to a control input and comprises the fuse and a first charge reservoir serially connected thereto for providing a first charge state;
    a reference path which is coupled to the control input and comprises a comparison element and a second charge reservoir serially connected thereto for providing a second charge state; and
    an evaluation unit comprising a first input connected to the fuse path in a switchable manner, a second input connected to the reference path in a switchable manner, and a data output for providing a condition of the fuse depending on a difference between the first and second charge states;
    wherein the first and second charge reservoirs are charged in parallel during a charge phase; and
    wherein the difference between the first and second charge states is provided during the charge phase.

2. The circuit arrangement according to claim 1, wherein the first charge state is provided at a first connection point between the fuse and the first charge reservoir depending on a first charge time constant which is defined by a resistance of the fuse and a capacity of the first charge reservoir, and wherein the second charge state is provided at a second connection point between the reference element and the second charge reservoir depending on a second charge time constant which is defined by a resistance of the reference element and a capacity of the second charge reservoir.

3. The circuit arrangement according to claim 2, wherein the evaluation unit comprises:
    a storage comparator comprising the first input which is coupled to the first connection point in a switchable manner, the second input which is coupled to the second connection point in a switchable manner, and the data output; and
    a charge state monitor comprising an input coupled to the data output (DA) of the storage comparator, and an output for providing a switching signal (Sw) for driving the storage comparator.

4. The circuit arrangement according to claim 3, wherein the condition of the fuse is provided at the data output in the form of a digital data signal and a digital data signal inverted thereto, and wherein the storage comparator comprises:
  a first inverter comprising an input coupled to the first input and an output for providing the data signal; and
  a second inverter comprising an input coupled to the second input and an output for providing the inverted data signal.

5. The circuit arrangement according to claim 4, wherein the output of the first inverter is connected to the input of the second inverter in a switchable manner and so as to be controlled by the switching signal, and the output of the second inverter is connected to the input of the first inverter in a switchable manner and so as to be controlled by the switching signal.

6. The circuit arrangement according to claim 3, wherein the condition of the fuse is provided at the data output in the form of a digital data signal and a digital data signal inverted thereto, and
  wherein the charge state monitor comprises a NAND gate with an input for supplying the digital data signal, a further input for supplying the inverted digital data signal, and an output for providing the switching signal.

7. The circuit arrangement according to claim 1, wherein the capacity of the first charge reservoir is matched with the capacity of the second charge reservoir and the resistance of the comparison element is different from the resistance of the fuse.

8. The circuit arrangement according to claim 1, wherein the condition of the fuse is provided at the data output in the form of a digital data signal and a digital data signal inverted thereto.

9. The circuit arrangement according to claim 1, wherein the control input is supplies with a digital control signal adapted for switching between discharge and charge phases of the circuit arrangement.

10. A method for determining a condition of a fuse, comprising the steps of:
  discharging a fuse path and a reference path, said fuse path comprising a fuse;
  charging the fuse path and the reference path, in a charge phase, a first charge state being generated in the fuse path as a function of a first charge time constant and a second charge state being generated in the reference path as a function of a second charge time constant, and the second charge state being generated in parallel with the first charge state; and
  determining the condition of the fuse depending on a difference between the first and second charge states during the charge phase.

11. The method according to claim 10, wherein a process of storing the condition of the fuse in an evaluation unit is provided after the determination of the condition of the fuse, said process being controlled by a switching signal.

12. The method according to claim 11, wherein the fuse path and the reference path are discharged again after storing the condition of the fuse.

13. The method according to claim 10, wherein any switching between charging and discharging processes is controlled by a supplied control signal.

14. A circuit arrangement comprising:
  a fuse;
  a fuse path which is coupled to a control input and comprises the fuse and a first charge reservoir serially connected thereto for providing a first charge state;
  a reference path which is coupled to the control input and comprises a comparison element and a second charge reservoir serially connected thereto for providing a second charge state; and
  an evaluation unit comprising a first input connected to the fuse path in a switchable manner, a second input connected to the reference path in a switchable manner, and a data output for providing a condition of the fuse depending on a difference between the first and second charge states;
  wherein the first charge state is provided at a first connection point between the fuse and the first charge reservoir depending on a first charge time constant which is defined by a resistance of the fuse and a capacity of the first charge reservoir, and wherein the second charge state is provided at a second connection point between the reference element and the second charge reservoir depending on a second charge time constant which is defined by a resistance of the reference element and a capacity of the second charge reservoir,
  wherein the evaluation unit comprises:
    a storage comparator comprising the first input which is coupled to the first connection point in a switchable manner, the second input which is coupled to the second connection point in a switchable manner, and the data output; and
    a charge state monitor comprising an input coupled to the data output of the storage comparator, and an output for providing a switching signal for driving the storage comparator;
  wherein the condition of the fuse is provided at the data output in the form of a digital data signal and a digital data signal inverted thereto;
  wherein the storage comparator comprises:
    a first inverter comprising an input coupled to the first input and an output for providing the data signal; and
    a second inverter comprising an input coupled to the second input and an output for providing the inverted data signal; and
  wherein the output of the first inverter is connected to the input of the second inverter in a switchable manner and so as to be controlled by the switching signal, and the output of the second inverter is connected to the input of the first inverter in a switchable manner and so as to be controlled by the switching signal.

* * * * *